(12) United States Patent
Tseng et al.

(10) Patent No.: US 8,493,253 B2
(45) Date of Patent: Jul. 23, 2013

(54) N-BIT DIGITAL-TO-ANALOG CONVERTING DEVICE

(75) Inventors: Wei-Hsin Tseng, Hsinchu (TW); Jieh-Tsorng Wu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 42 days.

(21) Appl. No.: 13/339,978

(22) Filed: Dec. 29, 2011

(65) Prior Publication Data

US 2012/0229315 A1  Sep. 13, 2012

(30) Foreign Application Priority Data

Mar. 7, 2011 (TW) .............................. 100107536 A (51) Int. Cl.
*H03M 1/66* (2006.01)
(52) U.S. Cl.
USPC ........................... 341/138; 341/144; 341/145
(58) Field of Classification Search
USPC .......................................... 341/144, 145, 136
See application file for complete search history.

(56) References Cited

U.S. PATENT DOCUMENTS

| | | | |
|---|---|---|---|
| 6,281,825 B1 * | 8/2001 | Lee | 341/144 |
| 6,362,765 B2 * | 3/2002 | Masuda | 341/144 |
| 6,448,917 B1 * | 9/2002 | Leung et al. | 341/144 |
| 7,023,368 B1 | 4/2006 | Sheng et al. | |
| 7,042,379 B2 | 5/2006 | Choe | |
| 7,576,675 B1 | 8/2009 | Lee et al. | |

OTHER PUBLICATIONS

Alex R Bugeja, Bang-Sup Song, Patrick L. Rakers, Steven F. Gillig, A 14-b, 100-MS/s CMOS DAC Designed for Spectral Performance, IEEE Journal of Solid-State Circuits, Dec. 1999, 1719-1732, vol. 34, No. 12.
Qiuting Huang, Pier Andrea Francese, Chiara Martelli, Jannik Nielsen, A 200MS/s 14b 97mW DAC in 0.18um CMOS, ISSCC 2004, Feb. 8, 2004, Session 20, 20.3.
Wei-Hsin Tseng, Jieh-Tsorng Wu, Yung-Cheng Chu, A CMOS 8-Bit 1.6-GS/s DAC With Digital Random Return-to-Zero, IEE Transactions on Circuits and Systems-II: Express Briefs, Jan. 2011, 1-5, vol. 58, No. 1.

* cited by examiner

*Primary Examiner* — Jean B Jeanglaude
(74) *Attorney, Agent, or Firm* — SmithAmundsen LLC; Dennis S. Schell (57) ABSTRACT

An N-bit digital-to-analog converting device includes: a decoder for converting an N-bit binary digital signal into a multi-bit thermometer code during each cycle of a clock signal alternating between first and second states, N being an integer not less than two; a random number generator for generating a reset signal having at least one high logic level bit and at least one low logic level bit that are equal in number and that have a random, time-varying arrangement; and a converting module coupled electrically to the decoder and the random number generator, and configured to convert the thermometer code into an analog voltage corresponding to the digital signal when the clock signal is in the first state, and to reset the analog voltage to a reset value according to the reset signal when the clock signal is in the second state.

21 Claims, 8 Drawing Sheets

N-BIT DIGITAL-TO-ANALOG CONVERTING DEVICE

CROSS-REFERENCE TO RELATED APPLICATION

This application claims priority of Taiwanese Application No. 100107536, filed on Mar. 7, 2011.

BACKGROUND OF THE INVENTION

1. Field of the Invention

The invention relates to a converting device, more particularly to an N-bit digital-to-analog converting device.

2. Description of the Related Art

Figure 1:
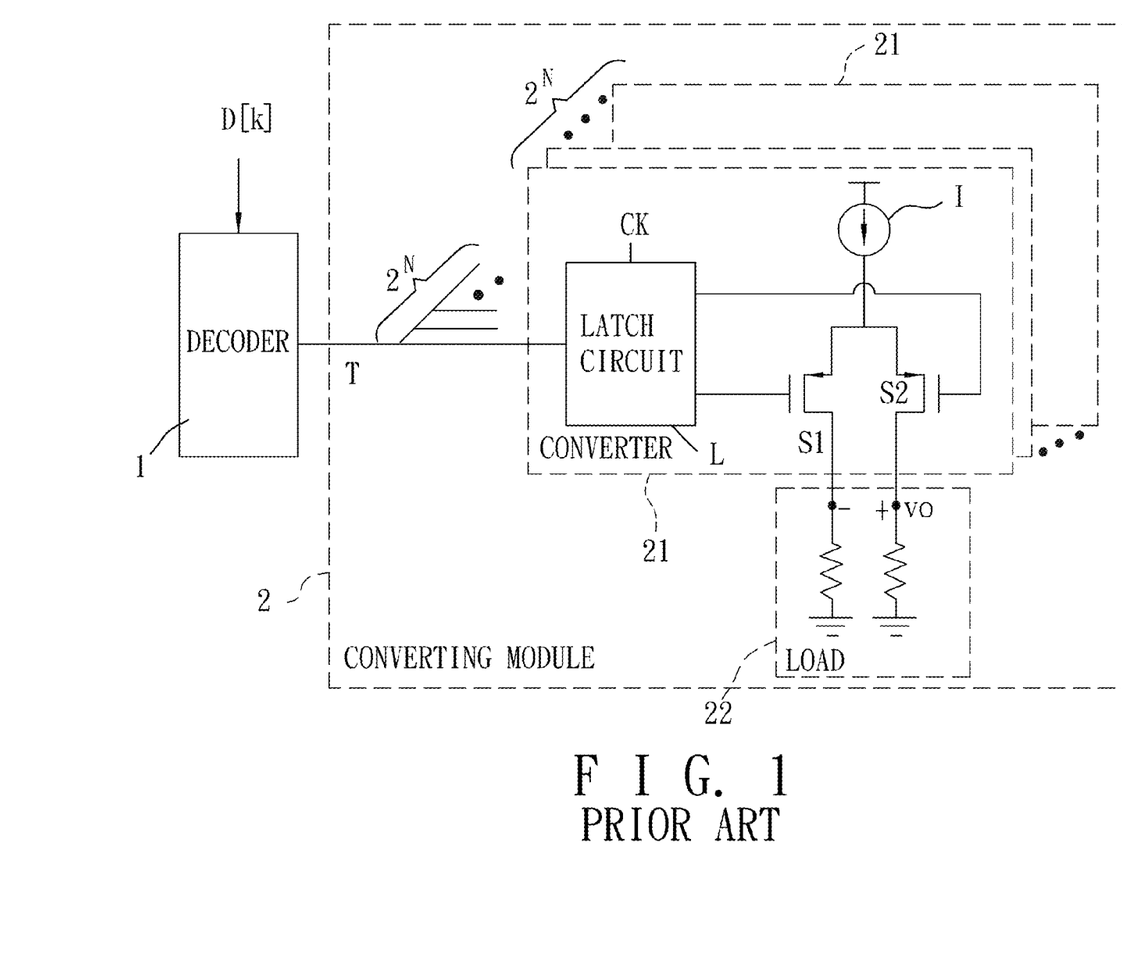
FIG. 1 is a circuit block diagram of a conventional N-bit digital-to-analog converting device.

Referring to FIG. 1, in C. H. Lin and K. Bult, "A 10-b, 500-MSample/s CMOS DAC in 0.6-$^2$," *IEEE J. Solid-State Circuits*, vol. 33, no. 12, 1948-1958, December 1998, there is disclosed a conventional N-bit digital-to-analog converting device that is adapted for receiving an N-bit binary digital signal D[k] and a clock signal (CK), and that is operable for outputting, within each cycle of the clock signal (CK), an analog voltage (vo) related to the digital signal D[k]. The N-bit digital-to-analog converting device includes a decoder 1 and a converting module 2.

When the N-bit binary digital signal D[k] is in an equally-weighted segmenting mode, the decoder 1 is adapted for receiving the N-bit binary digital signal D[k], and is operable to convert the N-bit binary digital signal D[k] received thereby into a thermometer code (T) represented by $2^N$ bits.

The converting module 2 includes a plurality ($2^N$) of converters 21 and a load 22.

Each of the converters 21 is adapted to receive the clock signal (CK), is coupled electrically to the decoder 1 for receiving therefrom a corresponding one of the $2^N$ bits that represent the thermometer code (T), is operable to generate a current with a current flow direction dependent on logic level of the corresponding one of the $2^N$ bits, and includes a latch circuit (L), a current source (I), a first switch (S1), and a second switch (S2). Operations among the latch circuit (L), the current source (I), the first switch (S1), and the second switch (S2) are described in the aforementioned publication, and hence will not be detailed hereinafter.

The load 22, which includes two resistors, is coupled electrically to the converters 21 and generates the analog voltage (vo) based on a summation of the currents generated by the converters 21.

Figure 2:
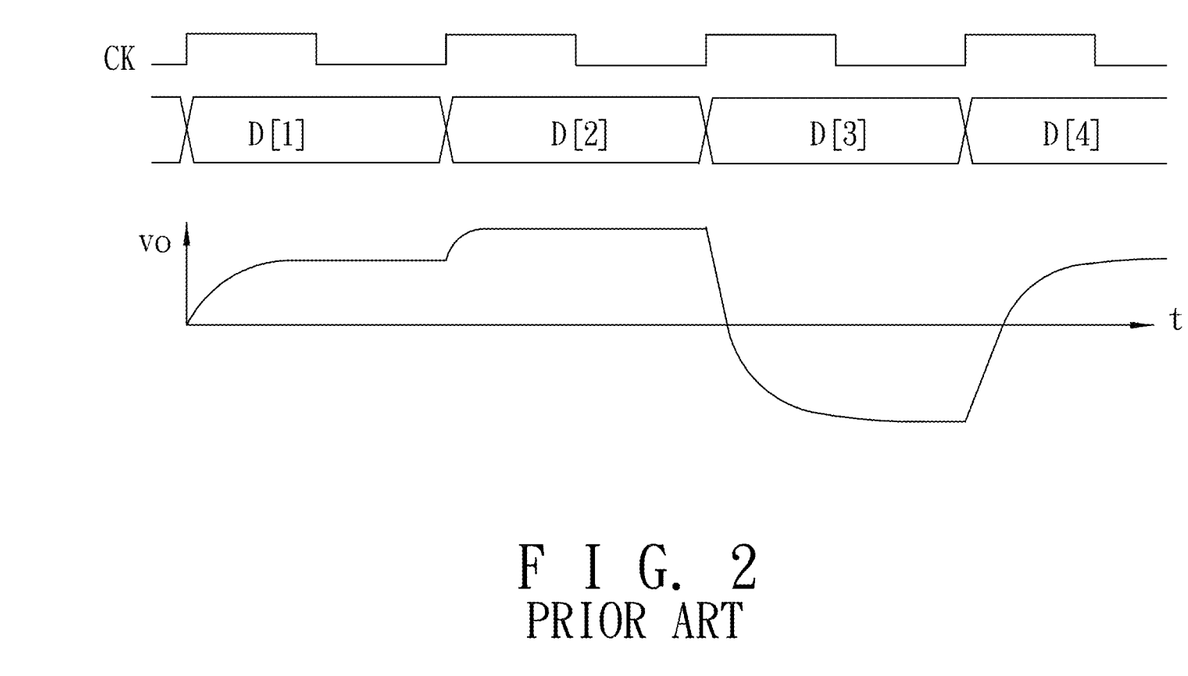
FIG. 2 is timing diagram of a digital signal and a clock signal provided to the conventional N-bit digital-to-analog converting device.

Shown in FIG. 2 is a timing diagram of the conventional N-bit digital-to-analog converting device, in which D[1]-D[4] are the values of the digital signal D[k] at four different time points, and the analog voltage (vo) is shown to vary according to the digital signal D[k]. Moreover, a non-ideal effect associated with switching of the first switch (S1) and the second switch (S2) causes a spurious wave to be present in the analog voltage (vo), which leads to a spurious free dynamic range (SFDR) degradation. Frequencies of switching of the first switch (S1) and the second switch (S2) are in a negative relation to the SFDR.

Figure 3:
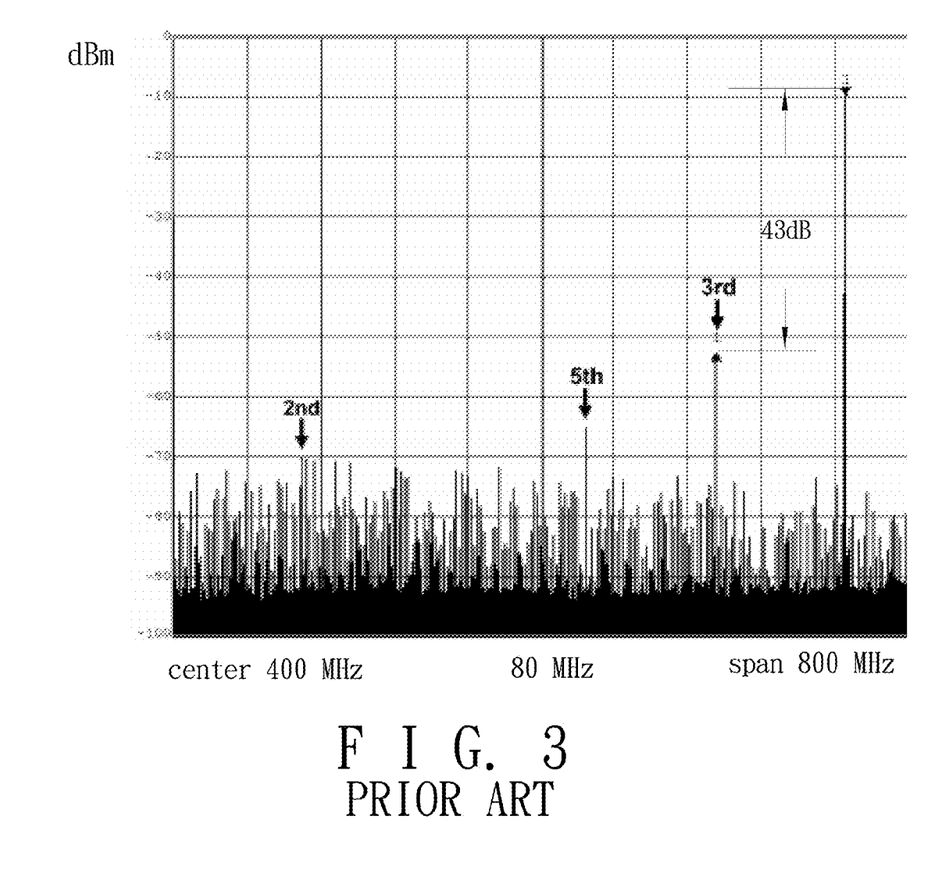
FIG. 3 is a plot of measured output obtained for the conventional N-bit digital-to-analog converting device.

FIG. 3 shows a plot of measured output obtained for the conventional N-bit digital-to-analog converting device in a configuration where the clock signal (CK) has a sampling rate of 1.6 GS/s and the digital signal D[k] has an input frequency of 731 MHz. It is apparent that the SFDR is reduced to 43 dB as a result of an increase in the third harmonic component attributed to the non-ideal effect associated with switching of the first and second switches (S1, S2).

SUMMARY OF THE INVENTION

Therefore, an object of the present invention is to provide an N-bit digital-to-analog converting device capable of achieving a relatively wide spurious free dynamic range.

According to the present invention, there is provided an N-bit digital-to-analog converting device for converting an N-bit binary digital signal into an analog voltage according to a clock signal that alternates between first and second states, N being an integer not less than two. The N-bit digital-to-analog converting device includes:

a decoder operable for converting the digital signal into a multi-bit thermometer code during each cycle of the clock signal;

a random number generator operable to generate a reset signal having at least one high logic level bit and at least one low logic level bit, the high and low logic level bits of the reset signal being equal in number and having a random, time-varying arrangement; and a converting module adapted for receiving the clock signal, coupled electrically to the decoder and the random number generator, and configured to convert the thermometer code into the analog voltage corresponding to the digital signal when the clock signal is in the first state, and to reset the analog voltage to a reset value according to the reset signal when the clock signal is in the second state.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 4:
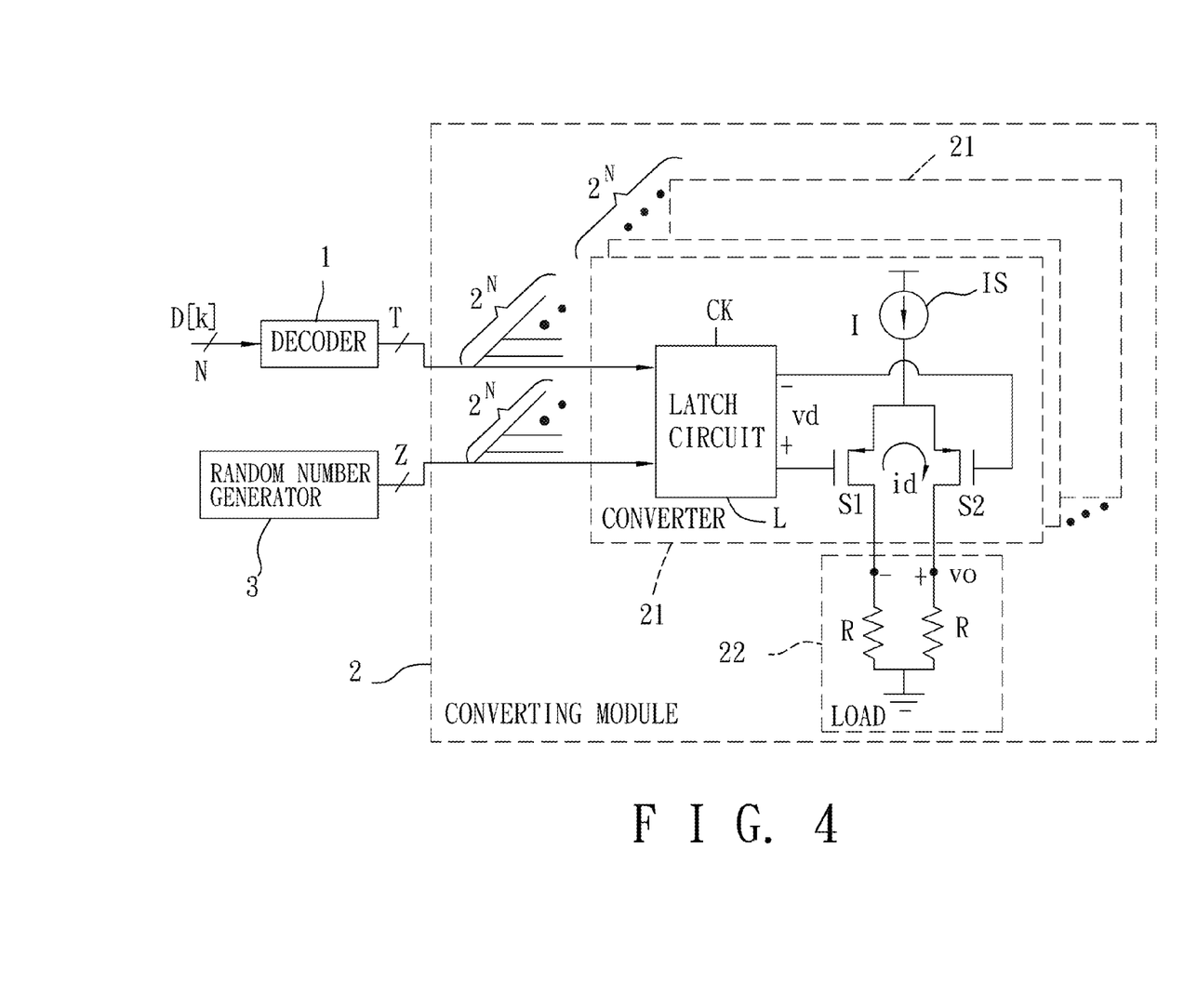
FIG. 4 is a circuit block diagram of the first preferred embodiment of an N-bit digital-to-analog converting device according to the present invention.

Referring to FIG. 4, the first preferred embodiment of an N-bit digital-to-analog converting device according to the present invention is for converting an N-bit binary digital signal D[k] into an analog voltage (vo) according to a clock signal (CK) that alternates between first and second states, N being an integer not less than 2. In this embodiment, the clock signal (CK) has a positive phase and a negative phase, which, in this embodiment, correspond to the first and second states of the clock signal (CK), respectively.

The N-bit digital-to-analog converting device includes a decoder 1, a converting module 2, and a random number generator 3. The decoder 1 is for converting the digital signal D[k] into a thermometer code (T) that has $2^N$ bits during each cycle of the clock signal.

The random number generator 3 is operable to generate a reset signal (Z) having a total number of high logic level bits and low logic level bits of $2^N$. The high logic level bits and the low logic level bits are equal in number (i.e., $2^{N-1}$) and have a random, time-varying arrangement. That is to say, the reset signal (Z) has $2^{N-1}$ of the high logic level bits and $2^{N-1}$ of the low logic level bits. In this embodiment, the arrangement of the high and low logic level bits of the reset signal (Z) varies between consecutive cycles of the clock signal.

A method of implementation of the random number generator 3 may be found in S. Haykin, *Communication Systems*, $4^{th}$ ed, Wiley & Sons, 2001. However, in practice, implementation of the random number generator 3 is not limited to such and may be otherwise in other embodiments.

The converting module 2 is adapted for receiving the clock signal (CK), is coupled electrically to the decoder 1 and the random number generator 3, and is configured to convert the thermometer code (T) into the analog voltage (vo) when the clock signal (CK) is in the first state, and to reset the analog voltage (vo) to a reset value (e.g., 0V) according to the reset signal (Z) when the clock signal (CK) is in the second state.

In the first preferred embodiment, the converting module 2 includes: a plurality ($2^N$) of converters 21 operable to convert respectively the bits of the thermometer code (T) into a plurality of differential currents (id) when the clock signal (CK) is in the first state; and a load 22 coupled electrically to the converters 21 and generating the analog voltage (vo) based on a summation of the differential currents (id). The differential currents (id) thus generated are applied to the load 22 for generating the analog voltage (vo) when the clock signal (CK) is in the first state. The converters 21 are further operable to convert respectively the high and low logic level bits of the reset signal (Z) into the differential currents (id) when the clock signal (CK) is in the second state. The differential currents (id) thus generated are applied to the load 22 when the clock signal (CK) is in the second state for resetting the analog voltage (vo) to the reset value.

Specifically, each of the converters 21 includes: a latch circuit (L) adapted for receiving the clock signal (CK), coupled electrically to the decoder 1 and the random number generator 3, and operable to convert the corresponding bit of the thermometer code (T) into a corresponding differential voltage (vd) with polarity based on logic state of the corresponding bit of the thermometer code (T) when the clock signal (CK) is in the first state, and to convert the corresponding one of the high and low logic level bits of the reset signal (Z) into a corresponding differential voltage (vd) with polarity based on logic state of the corresponding one of the high and low logic level bits of the reset signal (Z) when the clock signal (CK) is in the second state; a current source (IS) for generating a bias current (I); and first and second transistors (S1, S2) each having a first terminal coupled electrically to the current source (IS) for receiving the bias current (I) therefrom, a second terminal coupled electrically to the load 22, and a control terminal coupled electrically to latch circuit (L).

During operation, for each of the converters 21, the corresponding differential voltage (vd) from the latch circuit (L) is applied across the control terminals of the first and second transistors (S1, S2), which are responsive to the corresponding differential voltage (vd) received thereby to generate the corresponding differential current (id).

Thus, the analog voltage (vo) generated by the load 22 corresponds to the digital signal D[k] when the clock signal (CK) is in the first state, and is reset to the reset value when the clock signal (CK) is in the second state.

It is worth noting that, in this embodiment, each of the first and second transistors (S1, S2) is a p-type Metal-Oxide-Semiconductor Field-Effect Transistor (MOSFET) having a gate terminal, a source terminal, and a drain terminal that serve as the control terminal, the first terminal, and the second terminal, respectively. Further, the load 22 includes two resistors (R), each of which is coupled electrically between ground and the second terminal of a respective one of the first and second transistors (S1, S2) of each of the converters 21.

In an exemplary scenario in which N is equal to 2, the reset signal (Z) has two high logic level bits and two low logic level bits (e.g., 1100), and the converting module 2 includes four of the converters 21, when the clock signal (CK) is in the second state, the latch circuit (L) of each of the converters 21 is operable to convert a respective one of the bits (1100) of the reset signal (Z) into a differential voltage (vd) to cause one of the first and second transistors (S1, S2) of the converter 21 to conduct based on logic state of the respective bit of the reset signal (Z), thereby resetting the analog voltage (vo) to the reset value.

Figure 5:
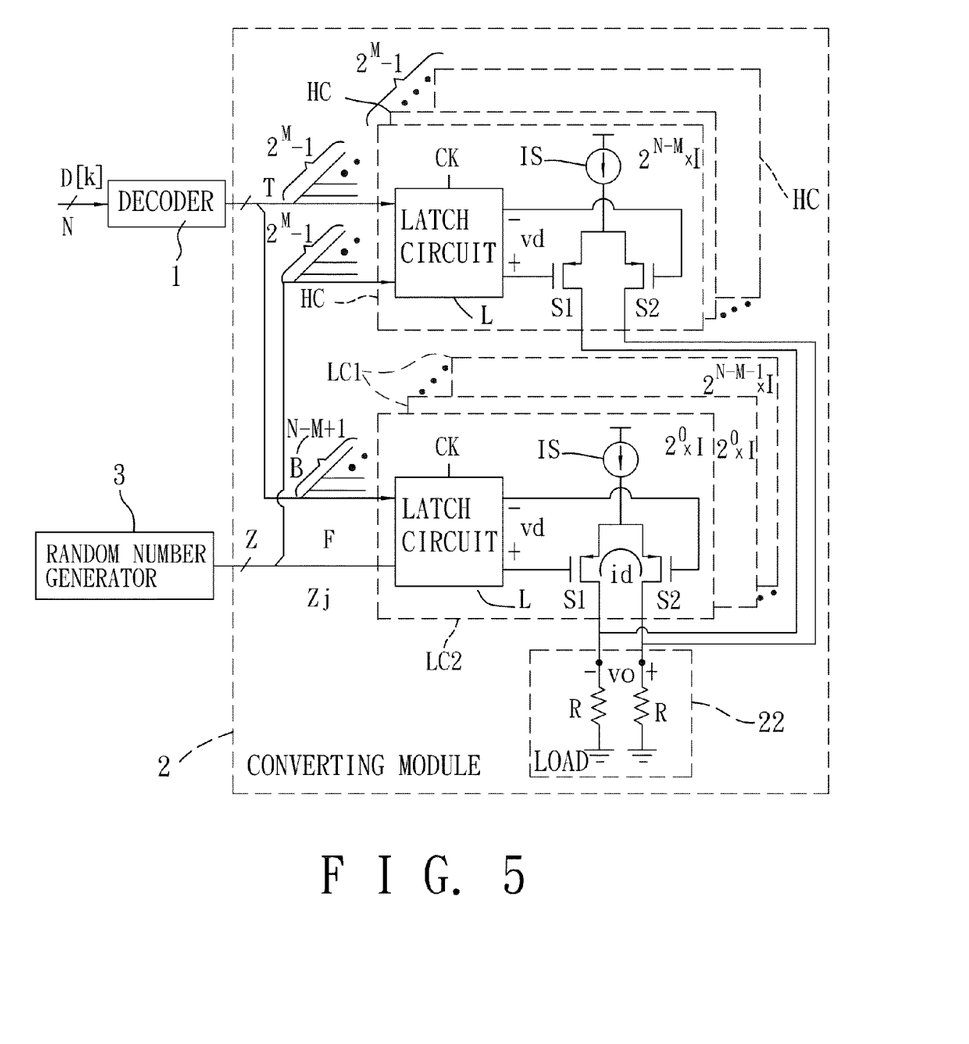
FIG. 5 is a circuit block diagram of the second preferred embodiment of an N-bit digital-to-analog converting device according to the present invention.

Shown in FIG. 5 is the second preferred embodiment of an N-bit digital-to-analog converting device according to the present invention.

In the second preferred embodiment, the decoder 1 is operable to, during each cycle of the clock signal (CK), convert the digital signal D[k] into the thermometer code (T) that has ($2^M-1$) bits, and a binary signal (B) that has (N−M) bits, and to generate a fixed differential mode signal (F) that has one bit, M and N being positive integers, M being smaller than N and not smaller than 1. In this embodiment, the converting modules 2 includes a plurality ($2^M-1$) of most-significant bit converters (HC), a plurality (N−M) of first least-significant bit converters (LC1), a second least-significant bit converter (LC2), and a load 22.

When the clock signal (CK) is in the first state: each of the most-significant bit converters (HC) is operable to convert a corresponding one of the bits of the thermometer (T) into a high-order differential current (id) having a magnitude of $2^{N-M}$ times that of a bias current (I) and a current flow direction dependent on logic state of the corresponding one of the bits of the thermometer code (T); each of the first least-significant bit converters (LC1) is operable to convert a corresponding one of the bits of the binary signal (B) into a low-order differential current (id) having a magnitude of $2^{x-1}$ times that of the bias current (I) and a current flow direction dependent on logic state of the corresponding one of the bits of the binary signal (B), where x is bit position of the corresponding one of the bits of binary signal (B) and ranges from 1 to N−M; the second least-significant bit converter (LC2) is operable to convert the bit of the fixed differential mode signal (F) into a low-order differential current (id) having a magnitude corresponding to that of the bias current (I) and a current flow direction dependent on logic state of the bit of the fixed differential mode signal (F); and the high-order and low-order differential currents (id) thus generated are applied to the load 22 for generating the analog voltage (vo) based on a summation of the high-order and low-order differential currents (id) thus generated.

Configuration of the random number generator 3 in this embodiment is identical to that in the first preferred embodiment. Each of the most-significant bit converters (HC) and the first and second least-significant bit converters (LC1, LC2) corresponds to a respective one of the high and low logic level bits of the reset signal (Z).

When the clock signal (CK) is in the second state: each of the most-significant bit converters (HC) is operable to convert the corresponding one of the high and low logic level bits of the reset signal (T) into a high-order differential current (id) having a magnitude of $2^{N-M}$ times that of the bias current (I) and a current flow direction dependent on logic state of the corresponding one of the high and low logic level bits of the reset signal (Z); each of the first least-significant bit converters (LC1) is operable to convert the corresponding one of the high and low logic level bits of the reset signal (Z) into a low-order differential current (id) having a magnitude of $2^{x-1}$ times that of the bias current (I) and a current flow direction dependent on logic state of the corresponding one of the high and low logic level bits of the reset signal (Z), where x is also bit position of the corresponding one of the high and low logic level bits of the reset signal (Z) and ranges from 1 to N−M; the second least-significant bit converter (LC2) is operable to convert the corresponding one of the high and low logic level bits of the reset signal (Z) into a low-order differential current (id) having a magnitude corresponding to that of the bias current (I) and a current flow direction dependent on logic state of the corresponding one of the high and low logic level bits of the reset signal (Z); and the high-order and low-order differential currents (id) thus generated are applied to the load 22 for resetting the analog voltage (vo) to the reset value.

In the second preferred embodiment, each of the most-significant bit converters (HC), the first least-significant bit converters (LC1), and the second least-significant bit converter (LC2) includes: a latch circuit (L) adapted for receiving the clock signal (CK), and coupled electrically to the decoder 1 and the random number generator 3; a current source (IS) for generating the bias current (I); and first and second transistors (S1, S2) each having a first terminal coupled electrically to the current source (IS) for receiving the bias current (I) therefrom, a second terminal coupled electrically to the load 22, and a control terminal coupled electrically to the latch circuit (L).

When the clock signal (CK) is in the first state, for each of the most-significant bit converters (HC), the first least-significant bit converters (LC1), and the second least-significant bit converter (LC2): the latch circuit (L) is operable to convert the corresponding one of the bits of the thermometer code (T), the binary signal (B), and the fixed differential mode signal (F) into a differential voltage with polarity based on logic state of the corresponding one of the bits of the thermometer code (T), the binary signal (B), and the fixed differential mode signal (F); the current source (IS) is operable for generating the bias current (I) with the magnitude of $2^{N-M}$ times for each of the most-significant bit converters (HC), the magnitude of $2^{x-1}$ times for each of the first least-significant bit converters (LC1), and unit magnitude for the second least-significant bit converter (LC2); and the differential voltage (vd) from the latch circuit (L) is applied across the control terminals of the first and second transistors (S1, S2), which are responsive to the differential voltage (vd) to generate the corresponding one of the high-order and low-order differential currents (id) applied to the load 22.

When the clock signal (CK) is in the second state, for each of the most-significant bit converters (HC), the first least-significant bit converters (LC1), and the second least-significant bit converter (LC2): the latch circuit (L) is operable to convert the corresponding one of the high and low logic level bits of the reset signal (Z) into the differential voltage with polarity based on logic state of the corresponding one of the high and low logic level bits of the reset signal (Z); the current source (IS) is operable for generating the bias current (I) with the magnitude of $2^{N-M}$ times for each of the most-significant bit converters (HC), the magnitude of $2^{x-1}$ times for each of the first least-significant bit converters (LC1), and unit magnitude for the second least-significant bit converter (LC2); and the differential voltage (vd) from the latch circuit (L) is applied across the control terminals of the first and second transistors (S1, S2), which are responsive to the differential voltage (vd) to generate the corresponding one of the high-order and low-order differential currents (id) applied to the load 22.

Configurations of the first and second transistors (S1, S2) in this embodiment are identical to those in the first preferred embodiment. In this embodiment, each of the resistors (R) of the load 22 is coupled electrically between ground and the second terminal of the respective one of the first and second transistors (S1, S2) of each of the most-significant bit converters (HC), the first least-significant bit converters (LC1), and the second least-significant bit converter (LC2).

In a scenario where N and M are equal to 4 and 2, respectively, and the reset signal (Z) has the bit arrangement of (1100), the latch circuit (L) of each of the three most-significant bit converters (HC) receives a respective one of the high and low logic level bits (110) of the reset signal (Z), and causes one of the first and second transistors (S1, S2) of each of the most-significant bit converters (HC) to conduct so as to output high-order differential currents having magnitudes of (+4×I), (+4×I), and (−4×I), respectively. On the other hand, the latch circuit (L) of each of the first and second least-significant bit converters (LC1, LC2) receives the remaining one of the high and low logic level bits (Zj) of the reset signal (Z), which has a logic level of 0, and causes one of the first and second transistors (S1, S2) of each of the bit converters (LC1, LC2) to conduct so as to provide differential currents having magnitudes of (−1×I), (−2×I), and (−1×I), respectively. Thus, the analog voltage (vo) is reset to the reset value, which, in the scenario, is 0, based on a summation of the differential currents of (+4×I), (+4×I), (−4×I), (−1×I), (−2×I), and (−1×I).

Figure 6:
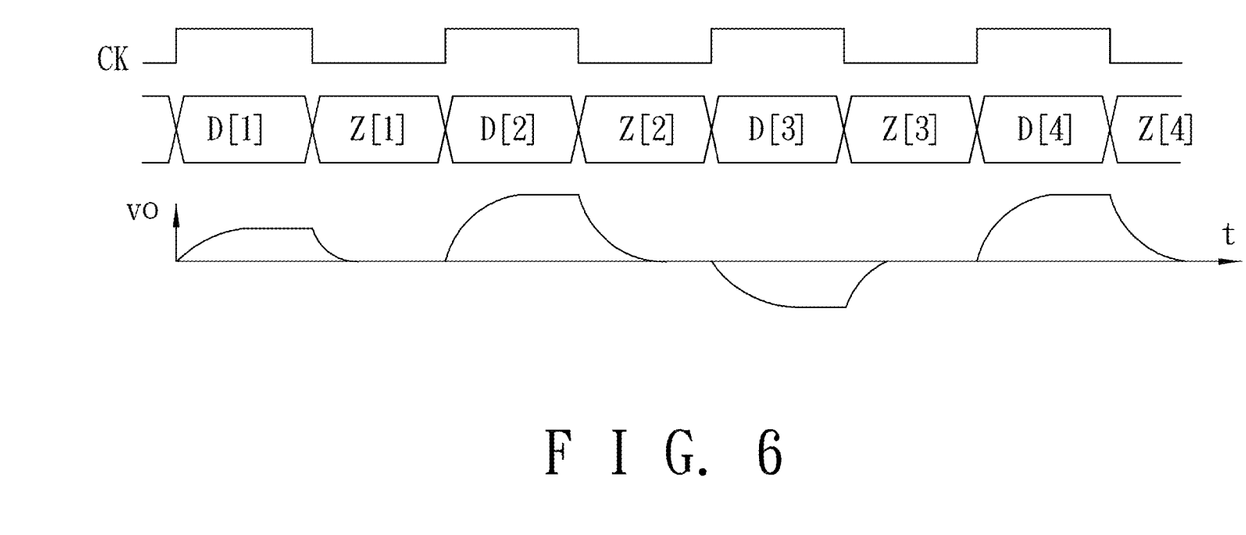
FIG. 6 is a timing diagram of a digital signal and a clock signal provided to the N-bit digital-to-analog converting device of the preferred embodiments.

Shown in FIG. 6 is a timing diagram in which D[1]-D[4] respectively represent values of the digital signal D[k] at different time points, and Z[1]-Z[4] respectively represent values of the reset signal Z at different time points. It can be understood from the timing diagram that, through resetting the analog voltage (vo) to 0V with the reset signal (Z), timing sequence of switching of the first and second transistors (S1, S2) may be rendered independent of the digital signal D(k) such that harmonic distortion caused by switching of the first and second transistors (S1, S2) is spread over the noise floor, thereby alleviating the problem of negative relation between SFDR and switching frequency of the first and second transistors (S1, S2).

Figure 7:
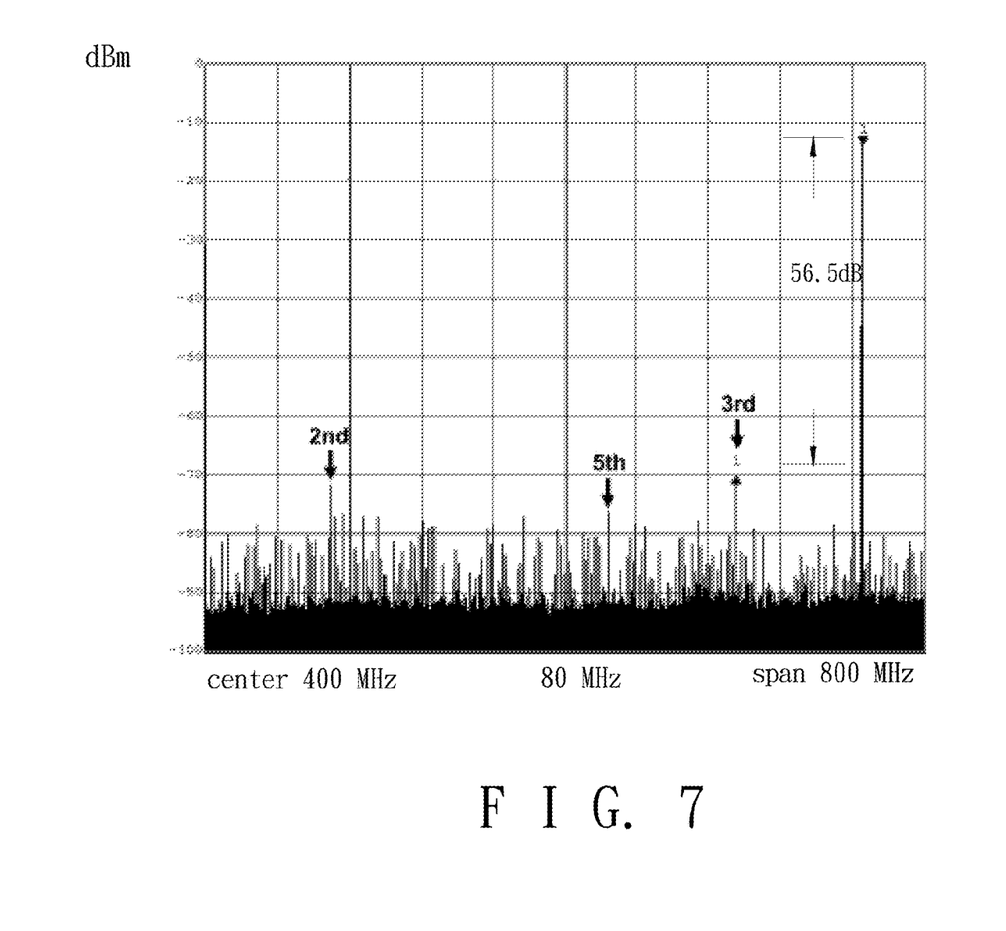
FIG. 7 shows a measured output spectrum obtained for the N-bit digital-to-analog converting device of this invention.

Shown in FIG. 7 is a plot of measurement in which input frequency of the digital signal D[k] is 731 MHz and sapling rate of the clock signal (CK) is 1.6 GS/s. It is apparent that the SFDR is increased to 56.5 dB.

Figure 8:
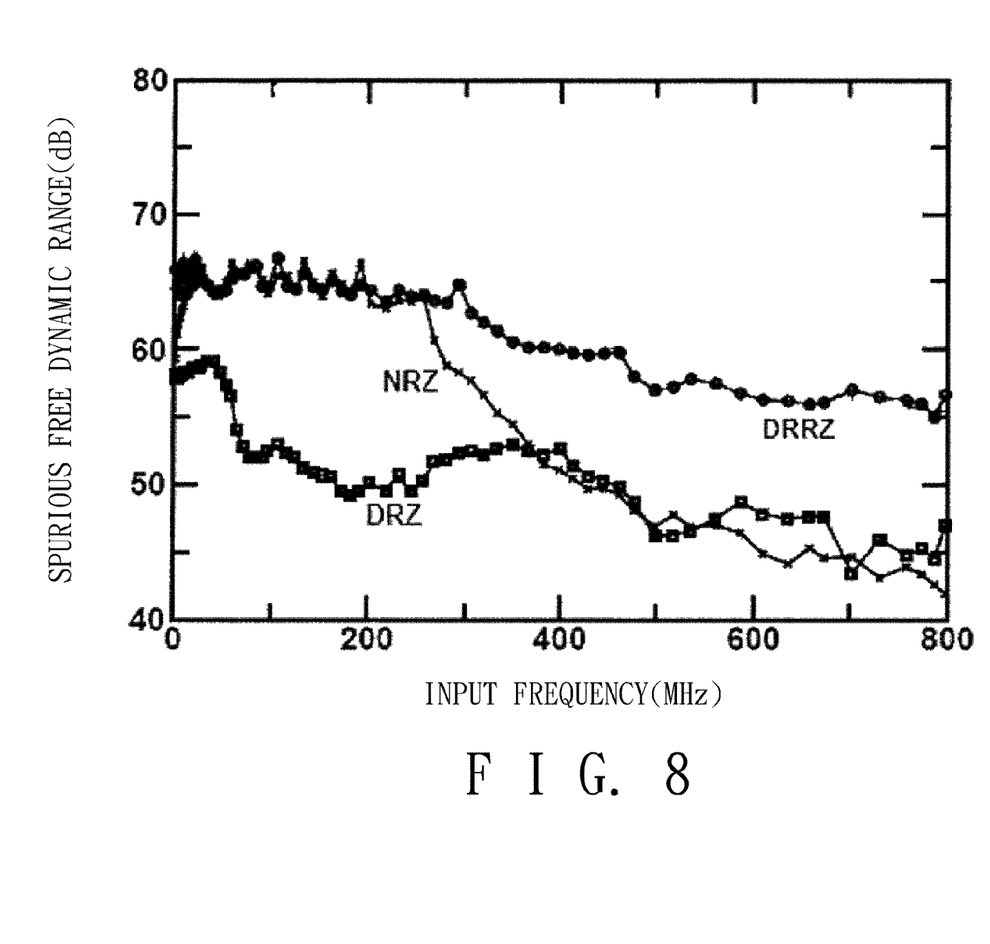
FIG. 8 shows a plot of measured spurious free dynamic ranges at different input frequencies.

Shown in FIG. 8 are plots of measured SFDR showing a comparison between this invention and the prior art at different input frequencies. The plot labeled "DRRZ" represents the invention, that labeled "NRZ" represents the prior art, and that labeled "DRZ" represents the case where the reset signal (Z) is non-varying. It is apparent that, as the input frequency increases toward 800 MHz, the SFDR of "NRZ" is reduced from 65 dB to 42 dB, and the SFDR of "DRRZ" exceeds 42 dB at frequencies below 460 MHz and exceeds 55 dB at frequencies below 800 MHz. Furthermore, the SFDR of "DRZ" is narrower than that of "NRZ" because, at a low input frequency, the first and second transistors (S1, S2) switch more in "DRZ" than in "NRZ".

In summary, by virtue of the reset signal (Z) generated by the random number generator 3, the scope of SFDR is relatively wide in the N-bit digital-to-analog converting device of this invention.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An N-bit digital-to-analog converting device for converting an N-bit binary digital signal into an analog voltage according to a clock signal that alternates between first and second states, N being an integer not less than two, said N-bit digital-to-analog converting device comprising:
   a decoder operable for converting the digital signal into a multi-bit thermometer code during each cycle of the clock signal;
   a random number generator operable to generate a reset signal having at least one high logic level bit and at least one low logic level bit, the high and low logic level bits of the reset signal being equal in number and having a random, time-varying arrangement; and
   a converting module adapted for receiving the clock signal, coupled electrically to said decoder and said random number generator, and configured to convert the thermometer code into the analog voltage corresponding to the digital signal when the clock signal is in the first state, and to reset the analog voltage to a reset value according to the reset signal when the clock signal is in the second state.

2. The N-bit digital-to-analog converting device as claimed in claim 1, wherein said converting module includes:
   a plurality of converters operable to convert the thermometer code into a plurality of differential currents when the clock signal is in the first state; and
   a load coupled electrically to said converters, and generating the analog voltage based on a summation of the differential currents.

3. The N-bit digital-to-analog converting device as claimed in claim 2, wherein the thermometer code has $2^N$ bits, and said converting module includes $2^N$ of said converters operable to convert respectively the bits of the thermometer code into the differential currents that are applied to said load when the clock signal is in the first state.

4. The N-bit digital-to-analog converting device as claimed in claim 3, wherein a total number of the high and low logic level bits of the reset signal is $2^N$, said converters being further operable to convert respectively the high and low logic level bits of the reset signal into the differential currents that are applied to said load when the clock signal is in the second state for resetting the analog voltage to the reset value.

5. The N-bit digital-to-analog converting device as claimed in claim 2, wherein each of said converters includes:
   a latch circuit adapted for receiving the clock signal, coupled electrically to said decoder and said random number generator, and operable to convert a corresponding bit of the thermometer code into a differential voltage when the clock signal is in the first state;
   a current source for generating a bias current; and
   first and second transistors each having a first terminal coupled electrically to said current source for receiving the bias current therefrom, a second terminal coupled electrically to said load, and a control terminal coupled electrically to said latch circuit, the differential voltage from said latch circuit being applied across said control terminals of said first and second transistors, said first and second transistors being responsive to the differential voltage to generate the differential current.

6. The N-bit digital-to-analog converting device as claimed in claim 5, wherein:
   the thermometer code has $2^N$ bits, and said converting module includes $2^N$ of said converters; and
   said latch circuit of each of said converters is operable to convert the corresponding bit of the thermometer code into the corresponding differential voltage, with polarity based on logic state of the corresponding bit of the thermometer code, when the clock signal is in the first state.

7. The N-bit digital-to-analog converting device as claimed in claim 6, wherein:
   a total number of the high and low logic level bits of the reset signal is $2^N$; and
   said latch circuit of each of said converters is operable to convert a corresponding one of the high and low logic level bits of the reset signal into a corresponding differential voltage, with polarity based on logic state of the corresponding one of the high and low logic level bits of the reset signal, when the clock signal is in the second state for resetting the analog voltage to the reset value.

8. The N-bit digital-to-analog converting device as claimed in claim 5, wherein each of said first and second transistors of each of said converters is a p-type Metal-Oxide-Semiconductor Field-Effect Transistor having a gate terminal, a source terminal, and a drain terminal that serve as said control terminal, said first terminal, and said second terminal, respectively.

9. The N-bit digital-to-analog converting device as claimed in claim 5, wherein said load includes two resistors, each of which is coupled electrically between ground and said second terminal of a respective one of said first and second transistors of each of said converters.

10. The N-bit digital-to-analog converting device as claimed in claim 1, wherein said decoder is operable to convert the digital signal into the thermometer code and a binary signal, and to generate a fixed differential mode signal, and wherein said converting module includes:
   at least one most-significant bit converter operable to convert the thermometer code into at least one high-order differential current when the clock signal is in the first state;
   at least one first least-significant bit converter operable to convert the binary signal into at least one first low-order differential current when the clock signal is in the first state;
   a second least-significant bit converter operable to convert the fixed differential mode signal into a second low-order differential current when the clock signal is in the first state; and
   a load coupled electrically to said at least one most-significant bit converter, said at least one first least-significant bit converter, and said second least-significant bit converter, and generating the analog voltage based on a summation of the high-order and low-order differential currents.

11. The N-bit digital-to-analog converting device as claimed in claim 10, wherein:
the thermometer code has ($2^M-1$) bits, the binary signal has (N−M) bits, and the fixed differential mode signal has one bit, M and N being positive integers, M being smaller than N and not smaller than 1;
said converting module includes ($2^M-1$) of said most-significant bit converters and (N−M) of said first least-significant bit converters;
when the clock signal is in the first state, each of said most-significant bit converters is operable to convert a corresponding one of the bits of the thermometer code into a high-order differential current having a magnitude of $2^{N-M}$ times that of a bias current and a current flow direction dependent on logic state of the corresponding one of the bits of the thermometer code;
when the clock signal is in the first state, each of said first least-significant bit converters is operable to convert a corresponding one of the bits of the binary signal into a low-order differential current having a magnitude of $2^{x-1}$ times that of the bias current and a current flow direction dependent on logic state of the corresponding one of the bits of the binary signal, where x is bit position of the corresponding one of the bits of the binary signal and ranges from 1 to N−M; and
when the clock signal is in the first state, said second least-significant bit converter is operable to convert the bit of the fixed differential mode signal into a low-order differential current having a magnitude corresponding to that of the bias current and a current flow direction dependent on logic state of the bit of the fixed differential mode signal; and
when the clock signal is in the first state, the high-order and low-order differential currents are applied to said load for generating the analog voltage.

12. The N-bit digital-to-analog converting device as claimed in claim 11, wherein each of said most-significant bit converters, said first least-significant bit converters, and said second least-significant bit converter includes:
a latch circuit adapted for receiving the clock signal, coupled electrically to said decoder and said random number generator, and operable to convert a corresponding one of the bits of the thermometer code, the binary signal, and the fixed differential mode signal into a differential voltage when the clock signal is in the first state;
a current source for generating the bias current with the magnitude of $2^{N-M}$ times for each of said most-significant bit converters, the magnitude of $2^{x-1}$ times for each of said first least-significant bit converters, and unit magnitude for said second least-significant bit converter; and
first and second transistors each having a first terminal coupled electrically to said current source for receiving the bias current therefrom, a second terminal coupled electrically to said load, and a control terminal coupled electrically to said latch circuit, the differential voltage from said latch circuit being applied across said control terminals of said first and second transistors, said first and second transistors being responsive to the differential voltage to generate a corresponding one of the high-order and low-order differential currents that is applied to said load when the clock signal is in the first state.

13. The N-bit digital-to-analog converting device as claimed in claim 12, wherein:
when the clock signal is in the first state, said latch circuit of each of said most-significant bit converters, said first least-significant bit converters, and said second least-significant bit converter is operable to convert the corresponding one of the bits of the thermometer code, the binary signal and the fixed differential mode signal into the differential voltage with polarity based on logic state of the corresponding one of the bits of the thermometer code, the binary signal and the differential mode signal.

14. The N-bit digital-to-analog converting device as claimed in claim 12, wherein each of said first and second transistors of each of said most-significant bit converters, said first least-significant bit converters and said second least-significant bit converters is a p-type Metal-Oxide-Semiconductor Field-Effect Transistor having a gate terminal, a source terminal, and a drain terminal that serve as said control terminal, said first terminal, and said second terminal, respectively.

15. The N-bit digital-to-analog converting device as claimed in claim 12, wherein said load includes two resistors, each of which is coupled electrically between ground and said second terminal of a respective one of said first and second transistors of each of said most-significant bit converters, said first least-significant bit converters, and said second least-significant bit converter.

16. The N-bit digital-to-analog converting device as claimed in claim 11, wherein:
a total number of the high and low logic level bits of the reset signal is $2^N$;
each of said most-significant bit converters and said first and second least-significant bit converters corresponds to a respective one of the high and low logic level bits of the reset signal;
when the clock signal is in the second state, each of said most-significant bit converters is operable to convert the corresponding one of the high and low logic level bits of the reset signal into a high-order differential current having a magnitude of $2^{N-M}$ times that of the bias current and a current flow direction dependent on the logic state of the corresponding one of the high and low logic level bits of the reset signal;
when the clock signal is in the second state, each of said first least-significant bit converters is operable to convert the corresponding one of the high and low logic level bits of the reset signal into a low-order differential current having a magnitude of $2^{x-1}$ times that of the bias current and a current flow direction dependent on the logic state of the corresponding one of the high and low logic level bits of the reset signal, where x is also bit position of the corresponding one of the high and low logic levels bits of the reset signal and ranges from 1 to N−M;
when the clock signal is in the second state, said second least-significant bit converter is operable to convert the corresponding one of the high and low logic level bits of the reset signal into a low-order differential current having a magnitude corresponding to that of the bias current and a current flow direction dependent on logic state of the corresponding one of the high and low logic level bits of the reset signal; and
when the clock signal is in the second state, the high-order and low-order differential currents are applied to said load for resetting the analog voltage to the reset value.

17. The N-bit digital-to-analog converting device as claimed in claim 16, wherein each of said most-significant bit converters, said first least-significant bit converters, and said second least-significant bit converter includes:

a latch circuit adapted for receiving the clock signal, coupled electrically to said decoder and said random number generator, and operable to convert a corresponding one of the bits of the thermometer code, the binary signal, and the fixed differential mode signal into a differential voltage when the clock signal is in the first state;

a current source for generating the bias current with the magnitude of $2^{N-M}$ times for each of said most-significant bit converters, the magnitude of $2^{x-1}$ times for each of said first least-significant bit converters, and unit magnitude for said second least-significant bit converter; and first and second transistors each having a first terminal coupled electrically to said current source for receiving the bias current therefrom, a second terminal coupled electrically to said load, and a control terminal coupled electrically to said latch circuit, the differential voltage from said latch circuit being applied across said control terminals of said first and second transistors, said first and second transistors being responsive to the differential voltage to generate a corresponding one of the high-order and low-order differential currents that is applied to said load when the clock signal is in the first state.

18. The N-bit digital-to-analog converting device as claimed in claim 17, wherein:

when the clock signal is in the first state, said latch circuit of each of said most-significant bit converters, said first least-significant bit converters, and said second least-significant bit converter is operable to convert the corresponding one of the bits of the thermometer code, the binary signal and the fixed differential mode signal into the differential voltage with polarity based on logic state of the corresponding one of the bits of the thermometer code, the binary signal and the differential mode signal.

19. The N-bit digital-to-analog converting device as claimed in claim 18, wherein:

when the clock signal is in the second state, said latch circuit of each of said most-significant bit converters, said first least-significant bit converters and said second least-significant bit converter is operable to convert a corresponding one of the high and low logic level bits of the reset signal into the differential voltage with polarity based on logic state of the corresponding one of the high and low logic level bits of the reset signal.

20. The N-bit digital-to-analog converting device as claimed in claim 17, wherein each of said first and second transistors of each of said most-significant bit converters, said first least-significant bit converters and said second least-significant bit converters is a p-type Metal-Oxide-Semiconductor Field-Effect Transistor having a gate terminal, a source terminal, and a drain terminal that serve as said control terminal, said first terminal, and said second terminal, respectively.

21. The N-bit digital-to-analog converting device as claimed in claim 17, wherein said load includes two resistors, each of which is coupled electrically between ground and said second terminal of a respective one of said first and second transistors of each of said most-significant bit converters, said first least-significant bit converters, and said second least-significant bit converter.

* * * * *